United States Patent
Scholand et al.

(10) Patent No.: US 8,462,757 B2
(45) Date of Patent: Jun. 11, 2013

(54) METHOD FOR ADJUSTING TRANSMITTER OUTPUT POWER

(75) Inventors: Tobias Scholand, Muelheim (DE); Michael Speth, Krefeld (DE)

(73) Assignee: Intel Mobile Communications GmbH, Neubiberg (DE)

( * ) Notice: Subject to any disclaimer, the term of this patent is extended or adjusted under 35 U.S.C. 154(b) by 1183 days.

(21) Appl. No.: 12/335,023

(22) Filed: Dec. 15, 2008

(65) Prior Publication Data

US 2010/0150126 A1    Jun. 17, 2010

(51) Int. Cl.
*H04B 7/216*    (2006.01)

(52) U.S. Cl.
USPC ............................ 370/342; 370/320; 370/441

(58) Field of Classification Search
USPC .......................................... 370/320, 342, 441
See application file for complete search history.

(56) References Cited

U.S. PATENT DOCUMENTS

| | | | | |
|---|---|---|---|---|
| 5,604,730 | A * | 2/1997 | Tiedemann, Jr. | 370/252 |
| 5,923,650 | A * | 7/1999 | Chen et al. | 370/331 |
| 6,137,994 | A * | 10/2000 | Alterman et al. | 455/69 |
| 6,563,810 | B1 * | 5/2003 | Corazza | 370/335 |
| 6,687,238 | B1 * | 2/2004 | Soong et al. | 370/335 |
| 6,982,593 | B2 * | 1/2006 | Robinson et al. | 330/10 |
| 2004/0203362 | A1 * | 10/2004 | Pattabiraman et al. | 455/41.2 |
| 2005/0053094 | A1 * | 3/2005 | Cain et al. | 370/469 |
| 2006/0068830 | A1 | 3/2006 | Klomsdorf et al. | |

OTHER PUBLICATIONS

3 GPP TS 25.101, Version 5.20.0, Dec. 2006. Universal Mobile Telecommunications Systems (UMTS); User Equipment (UE) Radio Transmission and Reception (FDD). p. 14.
3 GPP TS 25.101, Version 6.16.0, Mar. 2008. Universal Mobile Telecommunications Systems (UMTS); User Equipment (UE) Radio Transmission and Reception (FDD). pp. 16 and 30.
3 GPP TS Group Radio Access Network, Working Group 1: AH64: Enhanced Uplink 6.1: Comparison of PAR an Cubic Metric for Power De-rating. Meeting 37, Tdoc# R1-040642, Montreal, Canada May 10-14, 2004. pp. 6 and 7.
3 GPP TS 34.121-1, Version 7.6.0, Sep. 2007. Universal Mobile Telecommunications Systems (UMTS); User Equipment (UE) Conformance Specification; Radio Transmission and Reception (FDD); Part 1: Conformance Specification. 15 pgs.
3 GPP TS 34.121-1, Version 8.0.0, Sep. 2007. Universal Mobile Telecommunications Systems (UMTS); User Equipment (UE) Conformance Specification; Radio Transmission and Reception (FDD); Part 1: Conformance Specification. pp. 43-48.

* cited by examiner

*Primary Examiner* — Phuc Tran
(74) *Attorney, Agent, or Firm* — Eschweiler & Associates, LLC

(57) ABSTRACT

A description is given for a method for operating a wireless multichannel CDMA transmitter, wherein a power metric based on a particular signal configuration is determined, the power metric being determined as a function of power weighting factors used in the channels of the particular signal configuration, and wherein the transmitter output power is adjusted based on the power metric.

20 Claims, 4 Drawing Sheets w/ 4x E-DPDCH Cat. 6, $-0.11dB \leq (MPR-MPR_{approx}) \leq 0.09dB$ $\beta_{hs} = \{0,5,6,8,9,12,15,19,24,30\}/15$ $\beta_{ec} = \{5,6,8,9,12,15,19,24,30\}/15$ $\beta_{ed} = \{5,6,7,8,9,11,12,13,15,17,19,21,24,27,30,34,38,42,47,53,60,67,$
$75,84,95,106,119,134,150,168\}/15$

METHOD FOR ADJUSTING TRANSMITTER OUTPUT POWER

FIELD OF THE INVENTION

This invention relates to a method for adjusting the output power of a multichannel transmitter.

BACKGROUND OF THE INVENTION

In a radio transmitter usually the power amplifier consumes the largest portion of electrical power, in particular battery power in mobile communication units. As wireless data rates increase, mobile phones will increasingly operate at higher output power levels. However, the adjustment of too high transmit power may be inefficient in terms of, for example, power consumption, power efficiency, and factory costs.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF THE INVENTION

Figure 1:
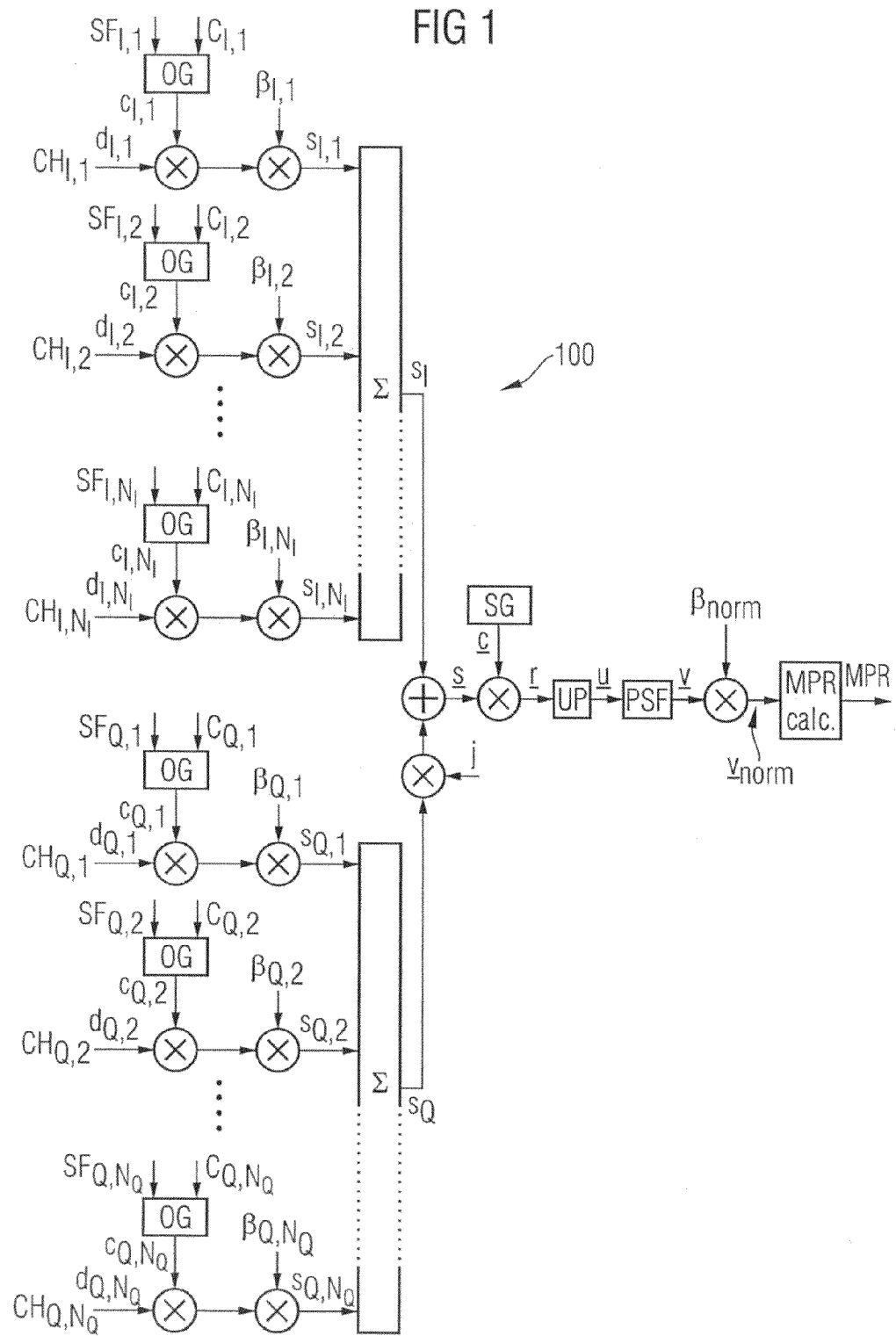
FIG. 1 schematically illustrates an apparatus 100 for generating a transmit signal.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The present invention relates to transmitters for mobile communication systems, and more particularly to a method for adjusting power amplifiers in the transmitters based on the configuration of the signal which is to be transmitted, for example based on the channel configuration of the signal. The transmitters may be part of high speed uplink and/or downlink data access enabled wireless communication devices.

The signal may be generated using digital signal processing and/or analog processing. For example, a signal may be generated in the base band using digital processing and may then be converted into a radio frequency (RF) band using analog signal processing.

The signal transmitted by the transmitter may, for example, be a CDMA (code division multiple access) signal. The CDMA system may, for example, be a UMTS (Universal Mobile Telecommunication System) system or any of the UMTS derivatives or extensions, and may be configured to transmit a plurality of parallel channels simultaneously. Each of the plurality of channels may be transmitted using a different OVSF (Orthogonal Variable Spreading Factor) code. Using a plurality of channels may be useful to provide high data rates. For example, the release 99 (R99) of the UMTS standard makes use of 2 OVSF codes at the user equipment transmitter (UE-TX) for the uplink connection to a base transceiver station. Accordingly, first generation 3GPP WCDMA power amplifiers were designed to provide linear amplification for a basic signal configuration including one control channel and one data channel with a known peak-to-average ratio (PAR) of approximately 3 dB. With this configuration, maximum power and efficiency could be optimized simultaneously while maintaining acceptable Adjacent Channel Leakage Ratio (ACLR) and error vector magnitude (EVM) levels.

Following UMTS or other mobile communications systems may comprise a dramatically increased signal configuration complexity. For example, HSDPA (High Speed Downlink Packet Access) in UMTS release 5 (R5) uses 3 channels and, consequently, three different OVSF codes, which causes the need to support approximately 1 dB of additional power amplifier headroom. HSUPA (High Speed Uplink Packet Access) in UMTS release 6 (R6) uses up to 7 parallel channels and, consequently, up to 7 different OVSF codes and thus requires even more power amplifier headroom. Future 3GPP releases or other mobile communication systems may increase the power amplifier headroom even further, for example by 4 dB or more. The efficiency of a power amplifier may degrade with increasing power amplifier headroom requirements. Optimization of the power amplifier headroom may therefore increase the efficiency of the power amplifier and the transmitter, and may reduce the power consumption and the power dissipation.

A mobile communication system may consist of several transmitters. The transmitters may be single transmitters or may be part of combined transmitters and receivers (transceivers). Each transmitter may use a different scrambling code, so that a receiver can determine the origin of a received data packet or signal.

FIG. 1 schematically illustrates an apparatus 100 for generating a user equipment uplink CDMA signal according to the UMTS standard or any of the derivatives or extensions such as HSDPA, HSUPA, LTE (Long Term Evolution), etc. The signal is formed from $N_I$ channels $CH_{I,1}$, $CH_{I,2}$, ..., $CH_{I,N_I}$ in the inphase (I) component of the transmit signal and from NQ channels $CH_{Q,1}$, $CH_{Q,2}$, ..., $CH_{Q,N_Q}$ in the quadrature (Q) component of the transmit signal, with $N_I$ and $N_Q$ being positive integers such as 2, 3, 7, etc. As indicated in FIG. 1, each channel corresponds to a data stream $d_{I,n_I}$ or $d_{Q,n_Q}$ with $n_I=1, 2, ..., N_I$ and $n_Q=1, 2, ..., N_Q$. In the example shown in FIG. 1, each channel uses a BPSK modulation (Binary Phase Shift Keying), i.e. the data stream $d_{I,n_I}$ and $d_{Q,n_Q}$ may be interpreted as data bits with data values +1 or −1, respectively. The use of BPSK modulated signals has only been chosen to keep the description simple and clear and is not meant to limit the invention, i.e. other modulation schemes may be used as well without departing from the scope of the invention.

Each of the BPSK modulated channels $CH_{I,n_I}$, $CH_{Q,n_Q}$ is spread coded with a spreading code $c_{I,n_I}$, $c_{Q,n_Q}$ by multiplying each of the data streams $d_{I,n_I}$, $d_{Q,n_Q}$ with a respective spreading code $c_{I,n_I}$, $c_{Q,n_Q}$. In the example shown in FIG. 1, the spreading codes $c_{I,n_I}$, $c_{Q,n_Q}$ are generated in an OVSF code generator OG based on a respective spreading factor $SF_{I,n_I}$, $SF_{Q,n_Q}$ and a respective OVSF spreading code number $C_{I,n_I}$, $C_{Q,n_Q}$.

After spread-coding the data streams $d_{I,n_I}$, $d_{Q,n_Q}$, $n_I=1, 2, \ldots, N_I$ and $n_Q=1, 2, \ldots, N_Q$, each of the spread-coded data streams is multiplied with a respective power weighting factor $\beta_{I,n_I}$ or $\beta_{Q,n_Q}$, resulting in $N_I$ I-channel signals $s_{I,n_I}$, $n_I=1, 2, \ldots, N_I$ and $N_Q$ Q channel signals $s_{Q,n_Q}$, $n_Q=1, 2, \ldots, N_Q$.

The sum of all I-channel signals $s_{I,n_I}$ results in the I-component $s_I$ and the sum of all Q-channel signals $s_{Q,n_Q}$ results in the Q-component $s_Q$. The sum $s_I+j*s_Q$ then gives the complex valued CDMA signal s.

In the example shown in FIG. 1, the complex-valued CDMA signal s is then scrambling coded with a scrambling code c provided by a scrambling code generator SG. The scrambling code may be used to identify from which transmitter a received signal has been transmitted. Scrambling coding the signal s may be achieved by multiplying s with the scrambling code c. The result of this multiplication are the CDMA chips r. The CDMA chips r are then up-sampled in an up-sampling unit UP to form an up-sampled signal u. The signal u is then filtered by a pulse shape filter PSF to obtain the digital or analog baseband representation v of the transmit signal. The pulse shape filter PSF may, for example, be realized as a root raised cosine (RRC) filter.

The magnitude |v| of the signal v is called the voltage waveform of the input signal. A specific transmit power may be realized by normalizing v to the normalized voltage waveform of the input signal, $v_{norm}$, by multiplying v with a normalization factor $\beta_{norm}$. The normalization factor $\beta_{norm}$ may, for example, be calculated by the equation $$\beta_{norm} = \sqrt{\sum_{n_I=1}^{N_I} \beta_{I,n_I}^2 + \sum_{n_Q=1}^{N_Q} \beta_{Q,n_Q}^2},$$

wherein $N_I$ and $N_Q$ are the number of the I and Q channels. The normalization factor $\beta_{norm}$ may also be defined in a different way but may be a function of the power weighting factors in one example.

Transmitting a signal with a plurality of OVSF codes from a UE (User Equipment) at high transmit power may be of concern in terms of power efficiency, power consumption and factory costs. Therefore, the transmitter may be allowed to reduce its maximum transmit power in case when many simultaneous OVSF codes are used, for example in a HSDPA, HSUPA or LTE system. This reduction may be described as the maximum power reduction (MPR). The MPR value may depend on various factors, for example the used OVSF-codes, the used weighting factors, the used pulse shaping filters (PSF), etc.

The following is an example for calculating an MPR value from the normalized voltage waveform $v_{norm}$ as indicated by FIG. 1. In this example, the MPR value is defined using a cubic power metric $$MPR = \frac{1}{2}\left[2 \cdot 20 \cdot \frac{\log_{10}(RMS(v_{norm}^3)) - \log_{10}(RMS(v_{norm,ref}^3))}{m}\right] - 1. \quad (1)$$

The MPR value of equation (1) may be described as a cubic metric (CM). $\lceil x \rceil$=ceil(x) corresponds to the ceiling function, i.e. $\lceil x \rceil$ is the smallest integer which is greater than or equal to x. m is a constant and may be known a priori. $v_{norm,ref}$ is a normalized waveform of a known reference signal and may also be known a priori. RMS(x) is the root mean square function $$RMS(x) = \sqrt{\frac{1}{N_m} \sum_{i=1}^{N_m} x_i^2},$$

wherein $N_m$ is a number of data values $x_i$, i=1, 2, ..., $N_m$, over which the root mean square value is calculated. In typical scenarios, the interval length may be roughly in the order of at least 1000, 10,000 or 100,000 samples in order to achieve sufficient accuracy.

The RMS value may also be written as $$RMS(x) = \sqrt{E(x^2)}$$

with E(x) being the mean value of x. The RMS value of $v^3$ may therefore be written as $$RMS(v^3) = \sqrt{E\{(|v|^3)^2\}} = \sqrt{E(|v|^6)}$$

and may thus be regarded as the sixth order moment of the magnitude of v. Focusing on a digital implementation, $RMS(v_{norm}^3)$ may be written as $$RMS(v_{norm}^3) = \lim_{N_m \to \infty} \sqrt{\frac{1}{N_m} \sum_{n=n_0}^{n_0+N_m-1} (Re(v_{norm}(n))^2 + Im(v_{norm}(n))^2)^3}$$

The MPR value of equation (1) may be calculated and may then be limited to values between 0 and 2.5, i.e. $0 \leq MPR \leq 2.5$, for example by saturation.

It is clear that the MPR value may also be defined in a different way depending on the needs of the specific implementation. For example, the MPR value may also be calculated from other signals such as the added signal s, the scrambling coded signal r or the up-sampled signal u. Further, it is clear that the MPR value may not only be defined by another signal, but may also be defined in a completely different way, for example using higher order contributions such as fifth or seventh order metrics. Different definitions for the MPR value may be chosen without departing from the scope of the invention.

The MPR value may be used to dynamically calculate and adjust the necessary power amplifier headroom according to the present input signal conditions or the conditions of a signal which is to be transmitted, for example the signal or channel configuration. For this purpose, a wireless communication transmit system may include a baseband processor electrically coupled to a transmitter, the transmitter having a transmitter output coupled to a power amplifier, the power amplifier having an output coupled to a front-end network with an antenna. A headroom controller may control the power amplifier headroom in response to the MPR value received from an MPR calculation unit, for example by selecting an optimal supply voltage and applying this supply voltage to the power amplifier or by selecting an optimized power amplifier impedance match in a variable impedance network.

The MPR value does not necessarily have to be calculated from the transmit signal. For example, it would be possible to calculate the MPR value of a signal which has the same or similar statistical properties of the real transmit signal. However, generating this similar signal would require an additional device or function.

However, in case of complex definitions such as the definition given in equation (1), the calculation of the MPR value using the definition itself may be cumbersome, in particular when the high number of samples is taken into account. For example, equation (1) does not give an MPR value as a simple or short function of characteristics of the transmit signal such as for example power weighting factors, scrambling codes, etc., but defines the MPR value as a statistical property of the overall transmit signal. Using a large number of data samples for evaluating the statistical properties may require computation time so that it may be difficult or impossible to obtain the calculation result in time, i.e. before the signal has to be transmitted. Evaluating the statistical properties for a shorter interval, i.e. a smaller number of samples, may strongly reduce the accuracy of the MPR value. Pre-computing MPR values for the possible CDMA signal configurations is not feasible even for conventional mobile communication systems because of the large number of possible configurations.

Figure 2:
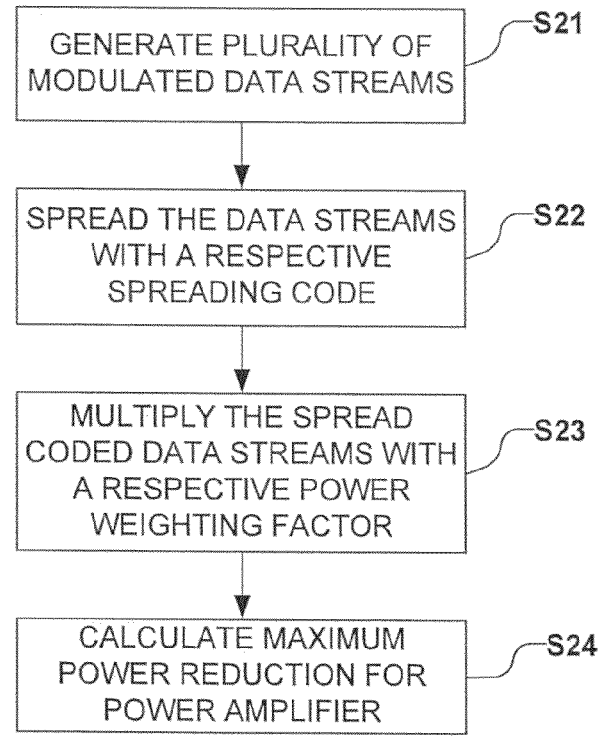
FIG. 2 schematically illustrates one embodiment of the inventive method.

FIG. 2 schematically illustrates one embodiment of the inventive method for computing an MPR value.

The method illustrated in FIG. 2 includes generating a plurality of modulated data streams (S21). The data streams may, for example, be binary data streams and may be assigned to different channels of the mobile communication system. For example, the data streams may be the data streams according to the UMTS standard or any of the derivatives thereof. The data streams may, for example, correspond to the data streams $d_{I,n_I}$, $n_I=1, 2, \ldots, N_I$ and $d_{Q,n_Q}$, $n_Q=1, 2, \ldots, N_Q$ and may be assigned to channels $CH_{I,n_I}$, $CH_{Q,n_Q}$ as described above with reference to FIG. 1.

The method illustrated in FIG. 2 includes spreading each one of the data streams with one of a plurality of spreading codes (S22). In the embodiment shown in FIG. 2, the respective spread code $c_{I,n_I}$, $c_{Q,n_Q}$ for each one of the plurality of channels $CH_{I,n_I}$, $CH_{Q,n_Q}$ is selected by a spreading factor $SF_{I,n_I}$, $SF_{Q,n_Q}$ and an OVSF code number $CH_{I,n_I}$, $CH_{Q,n_Q}$. In the embodiment shown in FIG. 2, each data stream is spread coded with a different spread code and all the OVSF codes used for the spread coding have to be orthogonal to each other. The chosen spread code configuration may be known to the transmitter and may thus be used later on as given information.

The method illustrated in FIG. 2 further includes multiplying each one of the data streams with one of a plurality of power weighting factors (S23) like power weighting factors $\beta_{I,n_I}$, $\beta_{Q,n_Q}$. In a case where the data stream is a binary signal with data bits +1 and −1 and where the spread code is a binary spread code with bits +1 and −1, the power weighted signal for the channels $CH_{I,n_I}$, $n_I=1, 2, \ldots, N_I$, include only data bits $+\beta_{I,n_I}$ or $-\beta_{I,n_I}$, and the channels $CH_{Q,n_Q}$, $n_Q=1, 2, \ldots, N_Q$, include only data bits $+\beta_{Q,n_Q}$ or $-\beta_{Q,n_Q}$.

The method illustrated in FIG. 2 further includes calculating a maximum power reduction for a power amplifier of the CDMA transmitter as a function of the used power weighting factors (S24), namely of the used power weighting factors $\beta_{I,n_I}$, $\beta_{Q,n_Q}$ with $n_I=1, 2, \ldots, N_I$ and $n_Q=1, 2, \ldots, N_Q$. This may further include receiving or accessing approximation parameters which are used to calculate an approximated MPR value MPR'.

Such an approximated MPR value MPR' may, for example, be defined before performing S21. The approximated MPR value MPR' may be a closed form function of properties of a respective signal configuration and may be easier to compute than the definition of the MPR value. The closed form function may include one or several approximation parameters which may be constant but system specific, i.e. may depend on the signal configuration of the signal for which the MPR value is to be calculated.

Properties of a respective signal configuration may for example be the OVSF code numbers $C_{I,n_I}$, $C_{Q,n_Q}$, the spreading factors $SF_{I,n_I}$, $SF_{Q,n_Q}$, the spread codes $c_{I,n_I}$, $c_{Q,n_Q}$, the scrambling code c, the pulse shape filters PSF, and/or the used power weighting factors $\beta_{I,n_I}$, $\beta_{Q,n_Q}$ used for the respective signal. The generation of the transmit signal may change with time, for example on a frame by frame or a slot by slot basis, and the configuration of the signal and the properties of the signal may change accordingly.

Various closed form functions may be defined for calculating an approximated MPR value MPR'. The closed form functions may include at least one or several properties of the signal configuration. However, not all of these properties of the signal may be required for determining the approximated MPR value MPR', for example in cases where the MPR value is found to be independent or only slightly dependent on a signal property such as the chosen scrambling code c, or when a property is constant for all signal configurations, for example the pulse shape filters. The required accuracy may determine which of the signal properties may be important for calculating an approximated MPR value MPR'. In one embodiment of the invention, only the chosen power weighting factors $\beta_{I,n_I}$, $\beta_{Q,n_Q}$ are used for determining the approximation parameters. In this case, the other contributions are neglected. In one embodiment, only the number of codes in the I and Q-channels or the number of I and Q-channels is used for determining the approximation parameters.

Figure 3:
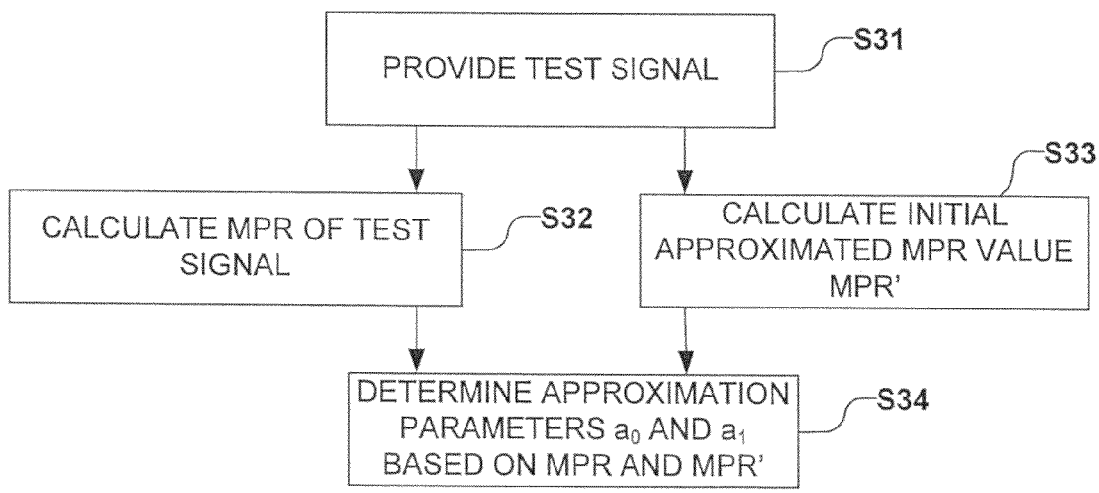
FIG. 3 schematically illustrates one embodiment of the method act for determining MPR approximation parameters.

FIG. 3 schematically illustrates one embodiment of a method for determining the approximation parameters for S24 of FIG. 2 using 2 approximation parameters $a_0$, $a_1$. For example, the approximated MPR value MPR' may be defined by $$MPR' = a_0 + a_1 \cdot \frac{E(|s|^6)}{\beta_{norm}^6}, \quad (2)$$

with the first approximation parameter $a_0$ and the second approximation parameter $a_1$. $\beta_{norm}$ is the normalization factor defined supra, and $E(|s|^6)$ is given by $$E(|s|^6) = \frac{1}{2^{N_I} \cdot 2^{N_Q}} \sum_{b_I=0}^{2^{N_I}-1} \sum_{b_Q=0}^{2^{N_Q}-1} \left( \left( \sum_{n_I=1}^{N_I} (-1)^{[b_I]_{n_I}} \cdot \beta_{I,n_I} \right)^2 + \left( \sum_{n_Q=1}^{N_Q} (-1)^{[b_Q]_{n_Q}} \cdot \beta_{Q,n_Q} \right)^2 \right)^3$$

with $[_b]_n$ being the n-th bit of the binary representation of $$b = \sum_{n=1}^{N} [b]_n \cdot 2^{n-1}.$$

Taking into account that the data values in the $n_I$-th of the power weighted inphase channels may be either $+\beta_{I,n_I}$ or $-\beta_{I,n_I}$ and $+\beta_{Q,n_Q}$ or $-\beta_{Q,n_Q}$ for the $n_Q$-th quadrature channel, $E(|s|^6)$ may also be written as $$E(|s|^6) = \frac{1}{2^{N_I} \cdot 2^{N_Q}} \sum_{b_I=0}^{2^{N_I/2}-1} \sum_{b_Q=0}^{2^{N_Q/2}-1} \left( \left( \sum_{n_I=1}^{N_I} (-1)^{[b_I]_{n_I}} \cdot \beta_{I,n_I} \right)^2 + \left( \sum_{n_Q=1}^{N_Q} (-1)^{[b_Q]_{n_Q}} \cdot \beta_{Q,n_Q} \right)^2 \right)^3$$

since only $b_I=0 \ldots 2^{N_I/2}-1$ and $b_Q=0 \ldots 2^{N_Q/2}-1$ have to be taken into account. The mean value $E(|s|^6)$ is the expected value of the sixth moment of the mean value of all possible values of $|s|^6$ and may thus be defined in a similar way for data streams which are not modulated with a BPSK scheme.

It is clear that the approximated MPR value MPR' may also be defined different from equation (2). The choice of such a definition may, for example, depend on a given transmitter, a transmit or power characteristic of the transmitter, a desired accuracy of the approximation in a certain parameter range, etc. The choice may also depend on the definition of the MPR value itself. Another example for defining an approximated MPR value MPR' could be $$MPR' = a_0 - a_1 \cdot \log \frac{\beta_{norm}^6}{E(|s|^6)} \quad (3)$$

In on embodiment, the approximation factors $a_0$, $a_1$ of the MPR approximation may be determined for a respective signal configuration using simulations. In the embodiment shown in FIG. 3, a test signal is provided in S31 in order to carry out the simulations. The test signal may be an arbitrary or random signal with a signal configuration that is equal to or similar to the transmit signal for which the MPR value should be calculated. The test signal may also be a particularly difficult signal in terms of power amplifier load. The test signal may, for example, consist of the same number of channels or may use the same power weighting factors as the signal for which the MPR value should be calculated.

In S32, the MPR value of the test signal is calculated according to the definition of the MPR value, for example according to equation (1). In S33, the approximated MPR value MPR' of the test signal is calculated according to the definition of the approximated MPR value MPR', for example according to equation (3). For the first calculation of an approximated MPR value MPR', starting values for the approximation parameters $a_0$ and $a_1$ such as $a_0=0$ and $a_1=1$ may be assumed. It is clear that different starting parameters are also possible. S32 and S33 may be performed in parallel, or may be performed after each other, e.g. S32 may be performed before or after S33.

In S34, the approximation parameters $a_0$ and $a_1$ are determined such that the approximated MPR value MPR' approximates the real MPR value, for example by minimizing the difference between the MPR value and the approximated MPR value MPR'. This may, for example, be achieved using an iterative optimization algorithm such as, for example, Newton's method.

In the embodiment shown in FIG. 3, the approximation parameters $a_0$ and $a_1$ take into account the statistical parameters of the OVSF codes, of the scrambling code and of the pulse shape filters PSF.

The resulting approximation parameters $a_0$ and $a_1$ may be used in S24 of FIG. 2 for calculating the approximated MPR value MPR' of the signal which is to be transmitted.

S31 to S34 shown in FIG. 3 may, for example, be performed between S23 and S24 of FIG. 2, for example if the approximation values are to be calculated during operation of the transmit device for a current transmit signal. S31 to S34 shown in FIG. 3 may also be performed in advance, e.g. may be pre-calculated before the generation of a transmit signal. There may be cases when the approximation values are to be pre-computed for all possible or for some of the possible signal configurations. The pre-calculated approximation factors may then be stored in a lookup table, e.g. a memory, and may be read from the lookup table or the memory during operation of the transmitter according to the current system conditions, in particular during generation of the next frame which is to be transmitted, for example directly after the signal configuration of the next data packet is known. In a case where approximation factors are pre-computed only for some of the possible signal configurations, it may be provided that the approximation values for missing signal configurations are interpolated from the pre-computed values or that the approximation values for missing signal configurations are calculated during operation of the transmitter as described above.

It is clear that approximated MPR values MPR' may include more than 2 approximation parameters, and that many more approximation parameters may be added. For example, in one embodiment using a third approximation parameter $a_2$, the approximated MPR value MPR' may for example be defined by $$MPR' = a_0 + a_1 \cdot \frac{E(|s|^6)}{\beta_{norm}^6} + a_2 \cdot \frac{P_U \cdot P_L}{\beta_{norm}^4}, \quad (4)$$

with $$P_U = \sum_{n_I=1}^{N_I} \beta_{I,n_I}^2 \Big|_{C_{I,n_I} < SF_{I,n_I}} + \sum_{n_Q=1}^{N_Q} \beta_{Q,n_Q}^2 \Big|_{C_{Q,n_Q} < SF_{Q,n_Q}}$$

and $$P_L = \sum_{n_I=1}^{N_I} \beta_{I,n_I}^2 \Big|_{C_{I,n_I} \geq SF_{I,n_I}} + \sum_{n_Q=1}^{N_Q} \beta_{Q,n_Q}^2 \Big|_{C_{Q,n_Q} \geq SF_{Q,n_Q}}.$$

The MPR approximation according to equation (4) allows a separation of the OVSF codes in OVSF codes of the so-called upper OVSF code tree, which consists of all OVSF codes with a code number smaller than the spreading factor, and the so-called lower OVSF code tree, which consists of all OVSF codes with a code number bigger than or equal to the spreading factor.

The method for calculating the 3 approximation parameters of equation (4) is similar to the method for calculating 2 approximation parameters described above, i.e. the approximation parameters may be determined by minimizing the difference between the approximated MPR value MPR' and the real MPR value according to its definition. However, in one embodiment it may be sufficient to define the third approximation value $a_2$ as a constant value which does not depend on the system conditions but is equal for all system conditions. Nevertheless, in another embodiment, one may determine the third approximation value $a_2$ for each signal configuration separately.

An approximated MPR value MPR' using 3 approximation parameters $a_0$, $a_1$, $a_2$ may be useful in HSUPA (UMTS R6), where upper and lower code trees are mixed, i.e. where OVSF-codes from both the upper and lower OVSF code tree are selected.

It may furthermore be useful to add further approximation parameters, for example to take into account whether particular OVSF codes have been used or not. It may also be possible to add further parameters and to specifically include dependencies on the spreading codes or the code numbers.

Figure 4:
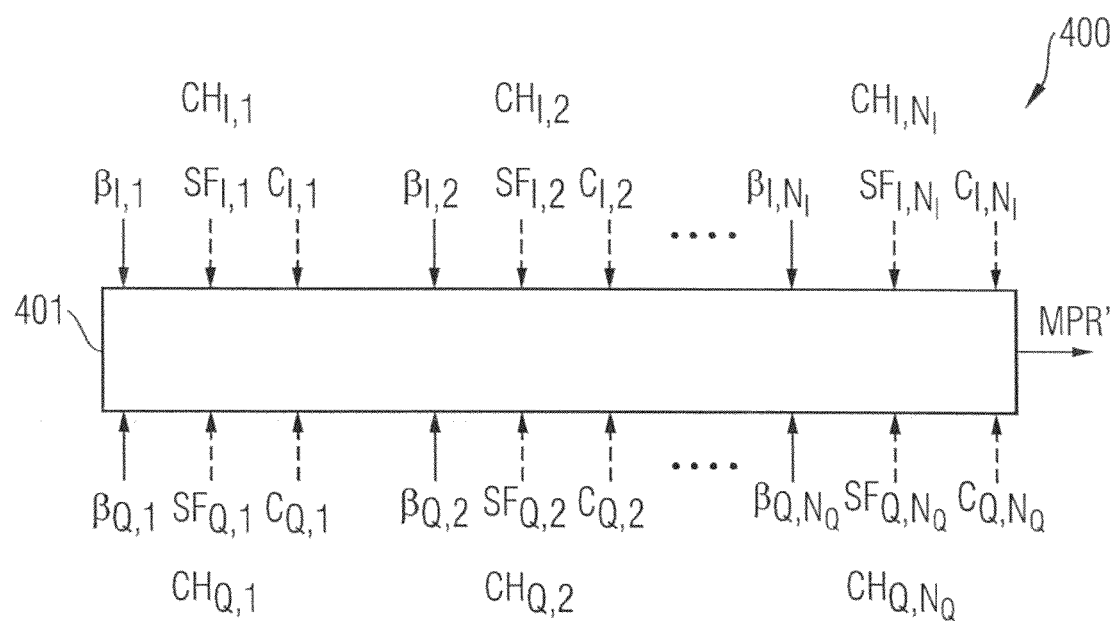
FIG. 4 schematically illustrates a device 400 for calculating an approximated MPR value.

FIG. 4 schematically illustrates a device 400 for calculating an approximated MPR value MPR'. The device includes a calculation unit 401 for calculating an approximated MPR value MPR' based on the OVSF code numbers $C_{I,n_I}$, $C_{Q,n_Q}$, the spreading factors $SF_{I,n_I}$, $Sf_{Q,n_Q}$ and the power weighting factors $\beta_{I,n_I}$, $\beta_{Q,n_Q}$ of each channel $CH_{I,n_I}$, $CH_{Q,n_Q}$, with $n_I=1, 2, \ldots, N_I$ and $n_Q=1, 2, \ldots, N_Q$ and outputs an approximated MPR value MPR'.

Figure 5:
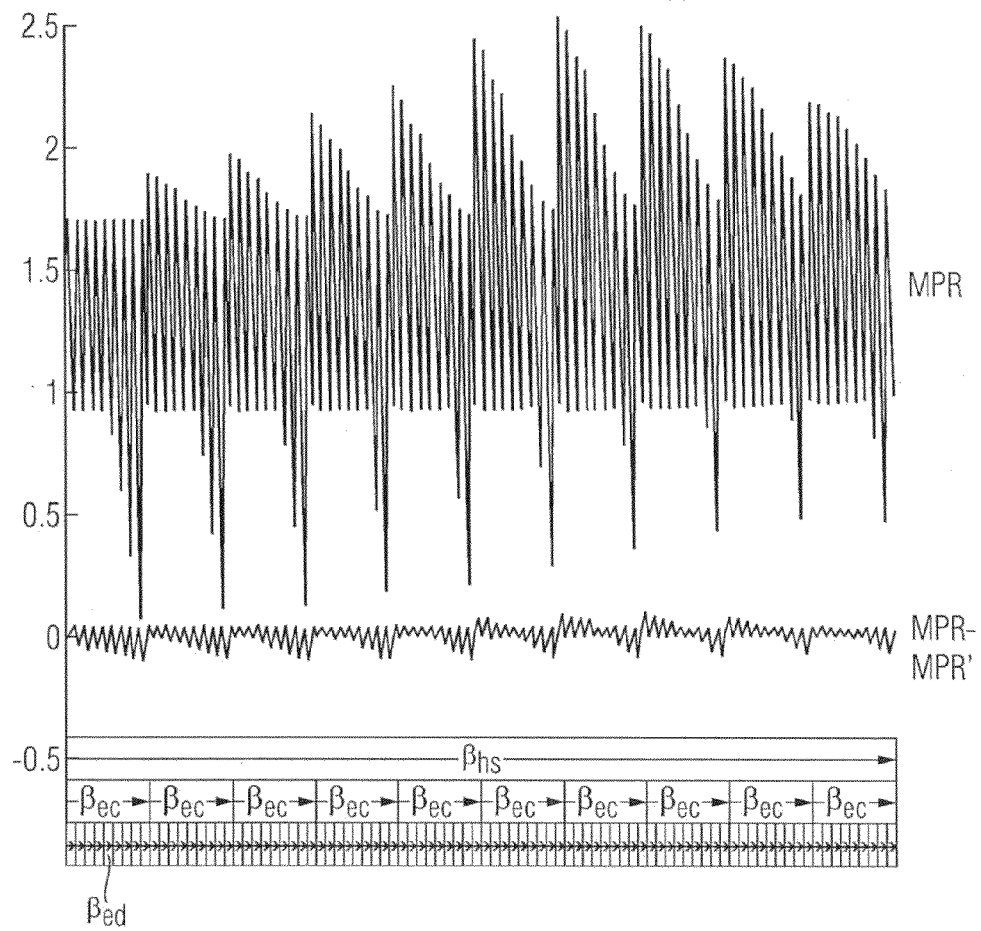
FIG. 5 schematically illustrates the results of one embodiment of the inventive method.

FIG. 5 schematically illustrates the results of an MPR approximation according to equation (3) based on the Cat. 6 operation with 7 channels DPCCH ($\beta_c$), HSDPCCH ($\beta_{hs}$), EDPCCH ($\beta_{ec}$), EDPDCH1 ($\beta_{ed1}$), EDPDCH2 ($\beta_{ed2}$), EDPDCH3 ($\beta_{ed3}$), EDPDCH4 ($\beta_{ed4}$). $\beta_c$ does not have to be considered because the other power weighting factors are normalized to $\beta_c$ in 3GPP. Accordingly, only $\beta_{hs}$, $\beta_{ec}$, and $\beta_{ed}$ are variable because 3GPP requires $\beta_{ed1}=\beta_{ed2}=\sqrt{2}\beta_{ed}$ and $\beta_{ed3}=\beta_{ed4}=\beta_{ed}$. The values of $\beta_{hs}$, $\beta_{ec}$ and $\beta_{ed}$ have been plotted in an interleaved manner. One period of the value $\beta_{ed}$ as indicated at the abscissa corresponds to the whole range of $\beta_{ed}$ values. Each block of 9 periods of $\beta_{ed}$ covers whole range of $\beta_{ec}$ values for constant $\beta_{hs}$. $\beta_{hs}$ is varied in each block from left to right.

From the above, it is clear that in one or more embodiments, signal configurations may be characterized by using only a subset of all available parameters. This may, for example, be useful when the MPR value does not depend on a respective parameter, or when the MPR value changes only slightly with the respective parameter or when the variation of the MPR value with this parameter is negligible. Accordingly, it may be sufficient to pre-compute the approximation parameters only for a subset of all the possible signal configurations. In the following, we will describe a particular signal configuration as a vector $p_i$, and the number of possible signal configurations, i.e. the total number of vectors $p_i$, may be given by $N_p$. A subset of signal configurations, described by the vectors $s_i$, may be chosen such that the number of signal configurations of the subset, $N_s$, is far less than the total number of signal configurations $N_p$. It is clear that the subsets may be defined individually by those skilled in the art. For example, the selected signal configurations $s_i$ of the subset may be non-uniformly or may be uniformly spaced over the possible signal configurations $p_i$ or may be chosen by neglecting a certain parameter, etc.

For example, the signal configuration may be described using only the power weighting factors $\beta_{I,n_I}$, $\beta_{Q,n_Q}$ of the channels $CH_{I,n_I}$, $CH_{Q,n_Q}$, $n_I=1, 2, \ldots, N_I$ and $n_Q=1, 2, \ldots, N_Q$.

In this case, the MPR value may be regarded as a function of the power weighting factors, $$MPR(s_i) = f(\beta_{I,1}, \beta_{I,2}, \ldots, \beta_{I,N_I}, \beta_{Q,1}, \beta_{Q,2}, \ldots, \beta_{Q,N_Q})$$
$$= f(s_i)$$

or for example by using the power weighting factors and the OVSF code numbers $C_{I,n_I}$, $C_{Q,n_Q}$ etc. In this case, the MPR value may be regarded as a function of the power weighting factors and the OVSF code numbers, $$MPR(s_i) = f(\beta_{I,1}, \beta_{I,2}, \ldots, \beta_{I,N_I}, \beta_{Q,1}, \beta_{Q,2}, \ldots, \beta_{Q,N_Q},$$
$$C_{I,1}, C_{I,2}, \ldots, C_{I,N_I}, C_{Q,1}, C_{Q,2}, \ldots, C_{Q,N_Q}).$$
$$= f(s_i).$$

An MPR value of a target vector $p_i$ which is not part of the subset $s_i$ may be calculated from the MPR values of the subset $s_i$ by interpolation. The interpolation may for example be based on all the MPR values of the subset, or may be based on only some of the MPR values of the subset, e.g. the nearest neighbors to the signal configuration $p_i$. The desired MPR value may then be regarded as a function of the MPR values of the subset used for the interpolation. For example, if the whole subset is used, the interpolated MPR value of $p_i$ may be calculated as a function of the MPR values of the whole subset, i.e.

$$MPR'(p_i)=f(MPR'(s_0),MPR'(s_1),\ldots,MPR'(s_{N_s}))$$

In one embodiment, one may define a metric or distance between the vector assigned to the desired signal configuration, $p_i$, and the vectors of the pre-computed approximated MPR values MPR'($s_i$), e.g.

$$w_{n_s} = \frac{|s_{n_s} - p_i|}{\sqrt{\sum_{N_s} |s_{n_s} - p_i|^2}}, \quad n_s = 0, 1, \ldots N_s$$

The interpolated MPR value of $p_i$ may then be calculated for example using a simple linear interpolation such as $$MPR'(p_i)=w_0 \cdot MPR'(s_0)+w_1 \cdot MPR'(s_1)+\ldots+w_{N_s} \cdot MPR'(s_{N_s})$$

It is clear to those skilled in the art that more complex interpolation methods may be used as well, for example Lagrange interpolation, Spline interpolation, etc.

The interpolation method may not only be used together with pre-computed approximated MPR values MPR', but may also be used when a subset of MPR values is calculated from the definition of the MPR value such as the definition given in equation (2).

The inventive method of calculating an MPR value allows to dramatically reduce the computation complexity and does not require huge lookup tables. The method further allows to obtain an MPR value without a large delay and without the necessity of providing a second transmitter for the generation of an artificial data stream. The method further allows realization of the calculation in software, i.e. using a micro controller. Nevertheless, a hardware centric solution is also possible.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of operating a wireless multichannel CDMA transmitter, the method comprising:
    generating a plurality of modulated data streams;
    spreading each one of the data streams with one of a plurality of spreading factors;
    multiplying each one of the spread data streams with a respective one of a plurality of power weighting factors; and
    calculating a maximum power reduction for a power amplifier of the CDMA transmitter as a function of the used power weighting factors.

2. The method of claim 1, further comprising:
    determining at least one approximation parameter for calculating the maximum power reduction.

3. The method of claim 2, wherein the at least one approximation parameter is determined by a comparison of an approximated maximum power reduction with a metric for the maximum power reduction.

4. The method of claim 3, wherein the at least one approximation parameter is determined by minimizing the difference between the approximated maximum power reduction and the metric for the maximum power reduction.

5. The method of claim 2, wherein an iterative method is used for determining the at least one approximation parameter.

6. The method of claim 3, wherein the approximated maximum power reduction and the metric for the maximum power reduction are computed using a test signal.

7. The method of claim 6, wherein the test signal is different from the signal formed from the plurality of data streams.

8. The method of claim 2, wherein the at least one approximation parameter is determined before the generation of a plurality of data streams.

9. A method in a wireless multichannel CDMA transmitter, the method comprising:
    configuring the wireless multichannel CDMA transmitter for a particular signal configuration using a test signal that reflects a transmit signal for the particular signal configuration;
    adjusting transmitter headroom based on the particular configuration, wherein the headroom is adjusted as a function of power weighting factors used in the channels of the particular signal configuration.

10. A method in a wireless multichannel CDMA transmitter, the method comprising:
    configuring the wireless multichannel CDMA transmitter for a particular signal configuration;
    adjusting transmitter headroom based on the particular configuration, wherein the headroom is adjusted as a function of power weighting factors used in the channels of the particular signal configuration;
    defining a power metric for calculating a maximum power reduction for all possible signal configurations of the CDMA transmitter; and
    defining an approximation of the power metric.

11. The method of claim 10, further comprising:
    calculating the maximum power reduction from the approximation of the power metric.

12. The method of claim 11, wherein at least one approximation parameter is determined for the approximation of the power metric.

13. The method of claim 12, wherein the at least one approximation parameter is determined individually for a particular signal configuration.

14. The method of claim 13, wherein the at least one parameter for the particular signal configuration is determined before configuring the wireless multichannel CDMA transmitter for the particular signal configuration.

15. The method of claim 14, wherein the transmitter headroom is adjusted based on the stored approximation parameter which has been determined particularly for the particular signal configuration.

16. The method of claim 13, wherein the at least one approximation parameter is determined and stored in a memory for a plurality of different signal configurations.

17. A method in a wireless multichannel CDMA transmitter, the method comprising:
    determining a maximum power reduction based on a particular signal configuration of the transmitter, a property of the particular signal configuration comprising at least one of spreading factors used for the respective signals and power weighting factors used for the respective signals, wherein the maximum power reduction is determined as a function of the particular signal configuration; and
    adjusting transmitter output power based on the maximum power reduction.

18. A method in a wireless multichannel CDMA transmitter, the method comprising:
    determining a metric based on a particular signal configuration of the transmitter, wherein the metric is determined as a function of the particular signal configuration; and
    adjusting transmitter output power based on the metric;
    selecting a set of second signal configurations, comprising at least one signal configuration; and
    calculating a value for each signal configuration of the set of second signal configurations from the metric.

19. The method of claim 18, wherein the metric is a measure of the difference between the particular signal configuration and the respective one of the set of second signal configurations.

20. The method of claim 19, further comprising:
- calculating a maximum power reduction for at least a subset of the set of second signal configurations;
- determining a maximum power reduction for the particular signal configuration from weighting the calculated maximum power reduction values with the values calculated from the metric.

* * * * *